(12) United States Patent
Gaussen

(10) Patent No.: US 7,746,133 B2
(45) Date of Patent: Jun. 29, 2010

(54) CHARGE PUMP CIRCUIT

(75) Inventor: Peter William Gaussen, Surrey (GB)

(73) Assignee: Sony United Kingdom Limited, Weybridge (GB)

( * ) Notice: Subject to any disclaimer, the term of this patent is extended or adjusted under 35 U.S.C. 154(b) by 48 days.

(21) Appl. No.: 12/064,374

(22) PCT Filed: Sep. 8, 2006

(86) PCT No.: PCT/GB2006/003347

§ 371 (c)(1),
(2), (4) Date: Feb. 21, 2008

(87) PCT Pub. No.: WO2007/029022

PCT Pub. Date: Mar. 15, 2007

(65) Prior Publication Data

US 2008/0224746 A1    Sep. 18, 2008

(30) Foreign Application Priority Data

Sep. 8, 2005    (GB) .................................. 0518343.9

(51) Int. Cl.
*H03L 7/00* (2006.01)
(52) U.S. Cl. ...................................... 327/157; 327/535
(58) Field of Classification Search .................. None
See application file for complete search history.

(56) References Cited

U.S. PATENT DOCUMENTS

| 5,986,487 A | 11/1999 | Ridgers | |
| 7,034,588 B2 * | 4/2006 | Cheung et al. | 327/157 |
| 2002/0089382 A1 | 7/2002 | Yang | |
| 2003/0231037 A1 * | 12/2003 | Lee et al. | 327/157 |
| 2005/0068090 A1 | 3/2005 | Chen et al. | |

FOREIGN PATENT DOCUMENTS

| EP | 1 229 657 | 8/2002 |
| JP | 2003 218694 | 7/2003 |

OTHER PUBLICATIONS

Rami Ahola, et al., "A 1.76-GHz 22.6-mW Deltasigma Fractional-N Frequency Synthesizer", IEEE Journal of Solid-State Circuits, vol. 38, No. 1, XP 001223269, pp. 138-140, 2003.

* cited by examiner

*Primary Examiner*—Cassandra Cox
(74) *Attorney, Agent, or Firm*—Oblon, Spivak, McClelland, Maier & Neustadt, L.L.P.

(57) ABSTRACT

A charge pump circuit including an input rail, an output rail, a voltage rail, a control line, an MOS input transistor including a gate and a channel connected between the input rail and the voltage rail, and an MOS output transistor including a gate and a channel connected between the output rail and the voltage rail. The gate of the input transistor is connected to the gate of the output transistor and a switch connects the channel of the output transistor to the voltage rail in response to a signal on the control line. The channel of an input cascode transistor connects the channel of the input transistor to the input rail and the channel of an output cascode transistor connects the channel of the output transistor to the output rail. The gate of the input cascode transistor is connected to the gate of the output cascode transistor.

38 Claims, 7 Drawing Sheets

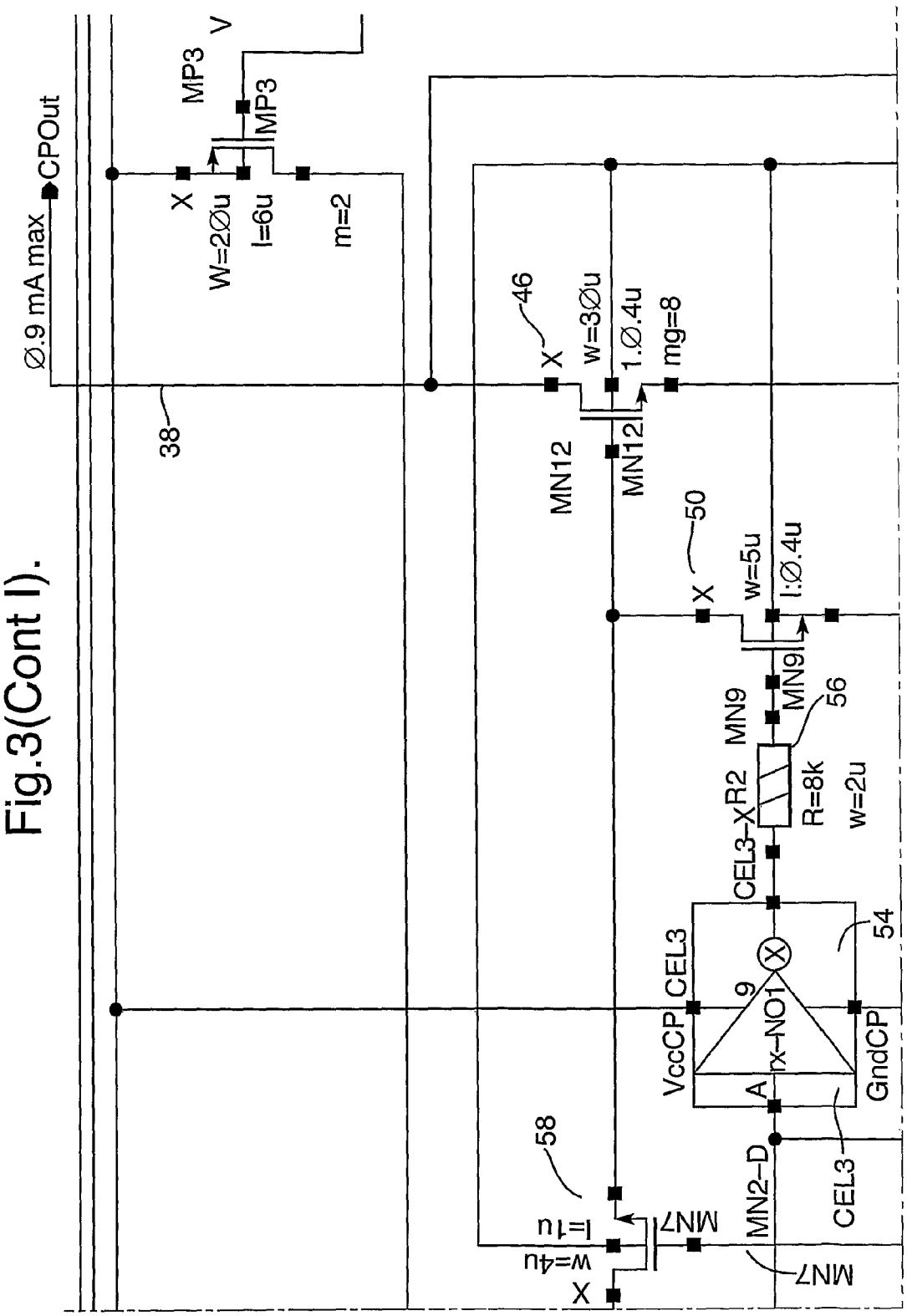
Fig.3(Cont I).

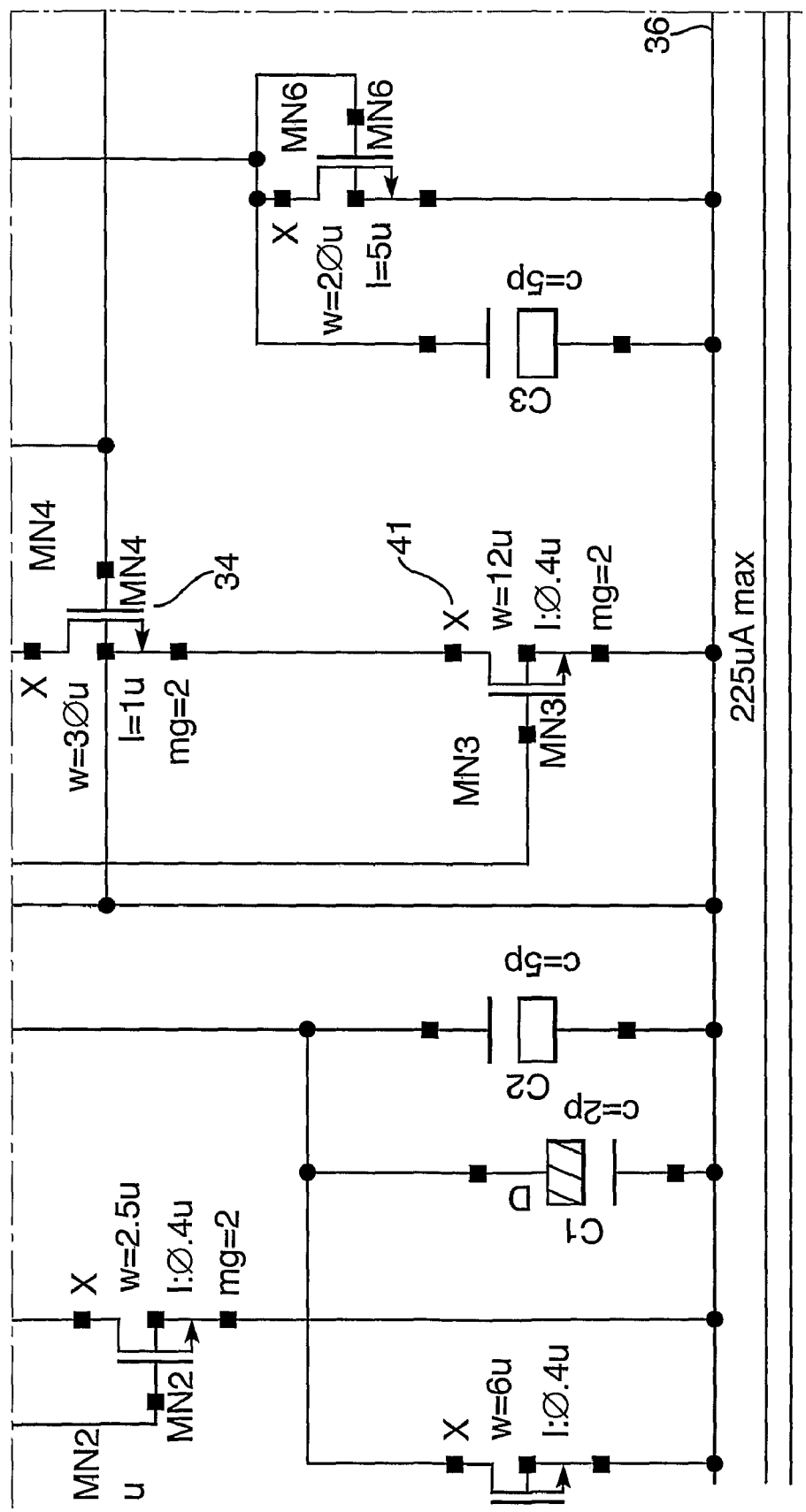
Fig.3(Cont II).

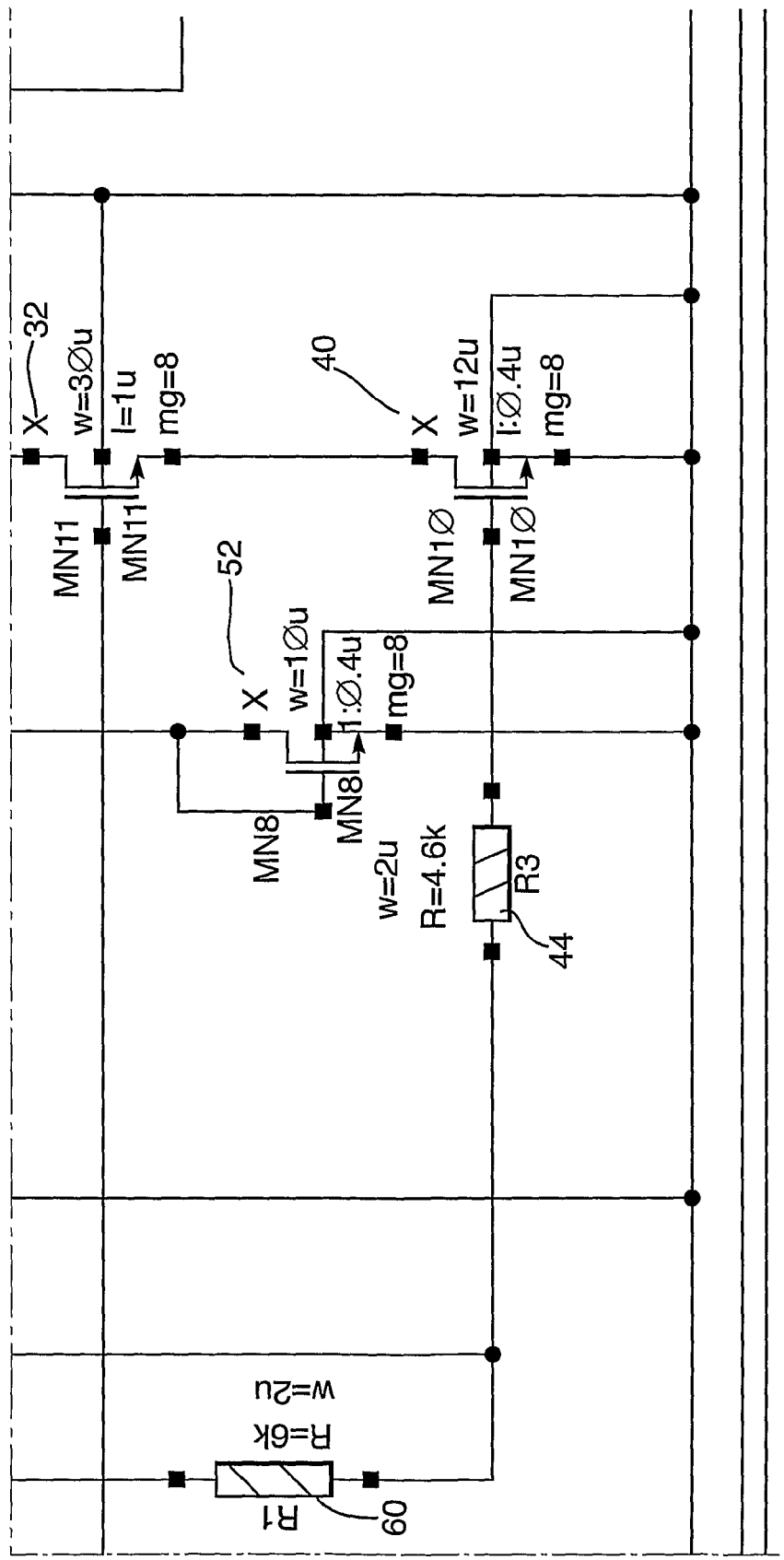
Fig.3(Cont III).

Fig.4.
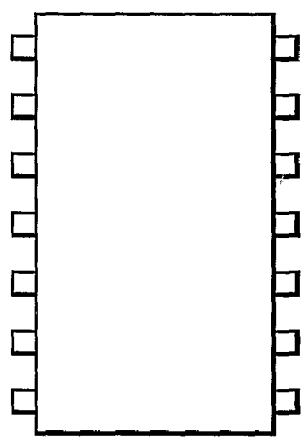
Fig.5.
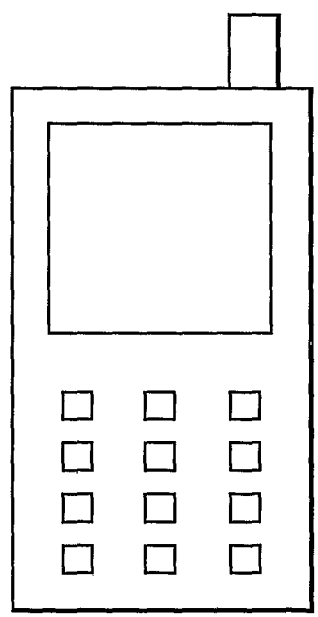
Fig.6.
Receiver

CHARGE PUMP CIRCUIT

The present invention relates to a charge pump circuit, in particular for use in a charge pump, for instance as part of a fractional-N frequency synthesizer.

Frequency synthesizers are known in which an oscillator is controlled by means of a phase-locked loop, a divided output of the oscillator being compared with a reference source or a division of that reference source. In a conventional integer N design, the output of the oscillator is divided by an integer N. However, it is also known to provide a fractional-N frequency synthesizer where the output of the oscillator is divided by a fraction of an integer N. In comparison to conventional integer N designs, fractional-N frequency synthesizers have fast lockup times, have low in-band phase noise and allow very fine frequency adjustments.

Unfortunately, however, fractional-N designs can suffer from a high level of spurious tones at sub-multiples of the reference frequency.

The present invention recognises that providing a charge pump with more linear characteristics, particularly for the higher frequencies required in a fractional-N frequency synthesizer circuit, will reduce the spurious tones.

According to the present invention, there is provided a charge pump circuit including:
an input rail;
an output rail;
a voltage rail;
a control line;
an MOS input transistor, the input transistor having a channel and a gate, the channel of the input transistor being connected between the input rail and the voltage rail;
an MOS output transistor, the output transistor having a channel and a gate, the channel of the output transistor being connected between the output rail and the voltage rail, the gate of the input transistor being connected to the gate of the output transistor;
a switch for connecting the channel of the output transistor to the voltage rail in response to a signal on the control line;
an MOS input cascode transistor, the input cascode transistor having a channel and a gate, the channel of the input cascode transistor connecting the channel of the input transistor to the input rail;
an MOS output cascode transistor, the output cascode transistor having a channel and a gate, the channel of the output cascode transistor connecting the channel of the output transistor to the output rail, the gate of the input cascode transistor being connected to the gate of the output cascode transistor; wherein
closing and opening said switch allows current to flow and not flow respectively between the output rail and the output transistor.

Conventionally, the output transistor would be controlled by a switch between its gate and the gate of the input transistor. However, due to capacitances and the like, switching of the output transistor by its gate does not cause an immediate switching of the channel. By locating a switch between the channel of the output transistor and the voltage rail, the switching characteristics are improved. The output cascode transistor improves/increases the output impedance of the circuit or alternatively reduces the output conductance. It does this by reducing the variation of the voltage across the channel of the MOS output transistor connected to its source. As a result, the output current is maintained more constant with variation of the voltage of the output.

In a frequency synthesizer, on each cycle of the reference frequency, the phase error is detected by a phase detector. The amount of charge dumped into a loop filter (connected between the charge pump and the oscillator) should vary linearly with the width of correction pulses produced by the phase detector. To make the charge pump as linear as possible, both the up and down pulses should have reached a stable and equal value before the current is switched off. The reference period in fractional-N synthesizers tends to be much shorter than in integer N synthesizers and therefore it is important to make the charge pump capable of operating for narrow pulse widths.

The charge pump circuit of the present invention can be used for producing one or other of the up and down pulses. In general, MOS transistors exhibit relatively high output conductance and also tend to suffer from switching spike feedthrough.

The location of the switch for the output transistor and the use of the cascode transistors helps to overcome these problems and provides a charge pump circuit which can be used at much higher frequencies than previous charge pump circuits whilst remaining relatively linear and avoiding the spurious tones mentioned above. The output cascode transistor also improves the turn-off characteristics of the circuit, improving the speed of the switching-off process.

Preferably, the charge pump circuit further includes a switched bias circuit connected between the gate of the output cascode transistor and the voltage line for biasing the voltage of the gate of the output cascode transistor in response to an absence of said signal on the control line such that the output cascode transistor inhibits flow of current through the output transistor.

By changing the bias voltages on the output cascode transistor, the output cascode transistor can be caused to switch on or switch off, in other words open or close its channel. In this way, the output cascode transistor can be caused to disconnect the output transistor from the output line at the same time as the switch disconnects the output transistor from the voltage rail. In this way, output to the output line can be turned off more rapidly and more assuredly. The charge pump circuit is thus better able to operate at high frequencies and is thus suitable for use in a fractional-N frequency synthesizer.

Preferably, the switched bias circuit includes an MOS switch transistor, the switch transistor having a channel and a gate, the channel of the switch transistor being connected in series with a bias element providing a voltage drop, the gate of the switch transistor being controlled by a voltage responsive to said signal on the control line.

Thus, according to the signal on the control line, the switch transistor opens or closes a path from the gate of the output cascode transistor to the bias element as connected to the voltage line. The element maintains a voltage difference between the gate of the output cascode transistor and the voltage line such that the output transistor and switch continue to operate correctly. However, the change in voltage at the gate of the output cascode transistor provides the required bias to operate the output cascode transistor to disconnect the output transistor from the output line.

Preferably, the bias circuit includes an inverter connecting the gate of the switch transistor to the control line.

Where all of the transistors are of the same type, either n or p-type, this provides a convenient way of controlling both the switch and the switch transistor with the same control line.

Preferably, a bias resistor is provided to connect the inverter to the gate of the switch transistor.

The resistor is advantageous in allowing balancing of the various components in the circuit. Furthermore, where two charge pump circuits are provided in a charge pump, one circuit being of n-type and the other circuit being of p-type, the resistors used in the n-type circuit can be chosen to be larger than those in the p-type circuit so as to compensate for the inherently slower response times of p-type devices.

Conceivably, the bias element could be embodied as a diode, but preferably, the element comprises an MOS bias transistor, the bias transistor including a channel and a gate, the channel of the bias transistor connecting the switch transistor to the voltage line and the gate of the bias transistor being connected between the channel of the bias transistor and the channel of the switch transistor.

In this way, the bias element shares characteristics with the transistors in the circuit, improving linearity and reducing spurious tones when used in the context of a frequency synthesizer.

The switch could be embodied in any convenient form, but, preferably, the switch is an MOS control transistor, the control transistor having a channel and a gate, the channel of the control transistor being connected between the voltage rail and the output transistor and the gate of the control transistor being connected to the control line.

This is not only a convenient way of embodying the switch in the context of other MOS transistors, but also provides a component with similar characteristics, such that the overall charge pump is more linear and, in the context of a frequency synthesizer provides fewer spurious tones.

Preferably, a switch resistor is provided to connect the control line to the gate of the control transistor.

This has advantages similar to those discussed for the resistors above.

Preferably, the charge pump circuit further includes an MOS compensation transistor, the compensation transistor having a channel and a gate, the channel of the compensation transistor connecting the input transistor to the voltage line and the gate of the compensation transistor being held at a fixed voltage.

This feature is advantageous in mirroring the control transistor, thereby providing symmetry to the circuit and improving its linearity.

Preferably, the charge pump circuit further includes a cascode switch responsive to said signal on the control line to connect the gate of the input cascode transistor to the gate of the output cascode transistor.

By using the cascode switch in conjunction with the bias circuit, the gate of the input cascode transistor can be isolated from the gate of the output cascode transistor when the bias circuit applies the required bias to the gate of the output cascode transistor. In this way, the bias applied to the output cascode transistor can be improved and the times of response reduced.

Preferably, the cascode switch comprises an MOS cascode control transistor, the cascode control transistor having a channel and a gate, the channel of the cascode control transistor being connected between the gate of the input cascode transistor and the gate of the output cascode transistor and the gate of the cascode control transistor being connected to control line.

This is particularly advantageous in improving the overall linearity of the circuit.

Preferably, a cascode resistor is provided to connect the control line to the gate of the cascode control transistor.

This has advantages similar to those discussed for the resistors above.

According to the present invention, there is also provided a charge pump for use in a fractional-N frequency synthesizer, the charge pump having a charge pump circuit as defined above using N-MOS transistors for pump-down and a charge pump circuit as defined above using P-MOS transistors for pump-up to complement the charge pump circuit using N-MOS transistors.

According to the present invention, there is also provided a fractional-N frequency synthesizer including:
a voltage controlled oscillator;
a fractional N divider connected to the output of the voltage controlled oscillator and providing a divided signal;
a phase comparator for comparing the divided signal with a reference signal and providing a comparison output;
a charge pump as defined above for receiving the comparison output as an input and providing pump down and pump up outputs; and
a filter for filtering a sum of the pump down and pump up outputs and providing the filtered sum as an input to the voltage controlled oscillator.

The charge pump or fractional-N frequency synthesizer can be provided as part of an integrated circuit, for instance a transceiver integrated circuit or a television tuner integrated circuit. The pump, synthesizer or integrated circuit could for example be included in a mobile telephone or a television receiver.

The invention will be more clearly understood from the following description, given by way of example only, with reference to the accompanying drawings, in which:

FIG. 4 illustrates an integrated circuit embodying the present invention;

FIG. 5 illustrates a mobile telephone embodying the present invention; and

FIG. 6 illustrates a television receiver embodying the present invention.

It is well known to provide a stable oscillating signal by means of a phase-locked loop making reference to a known source of oscillation, such as a crystal.

Figure 1:
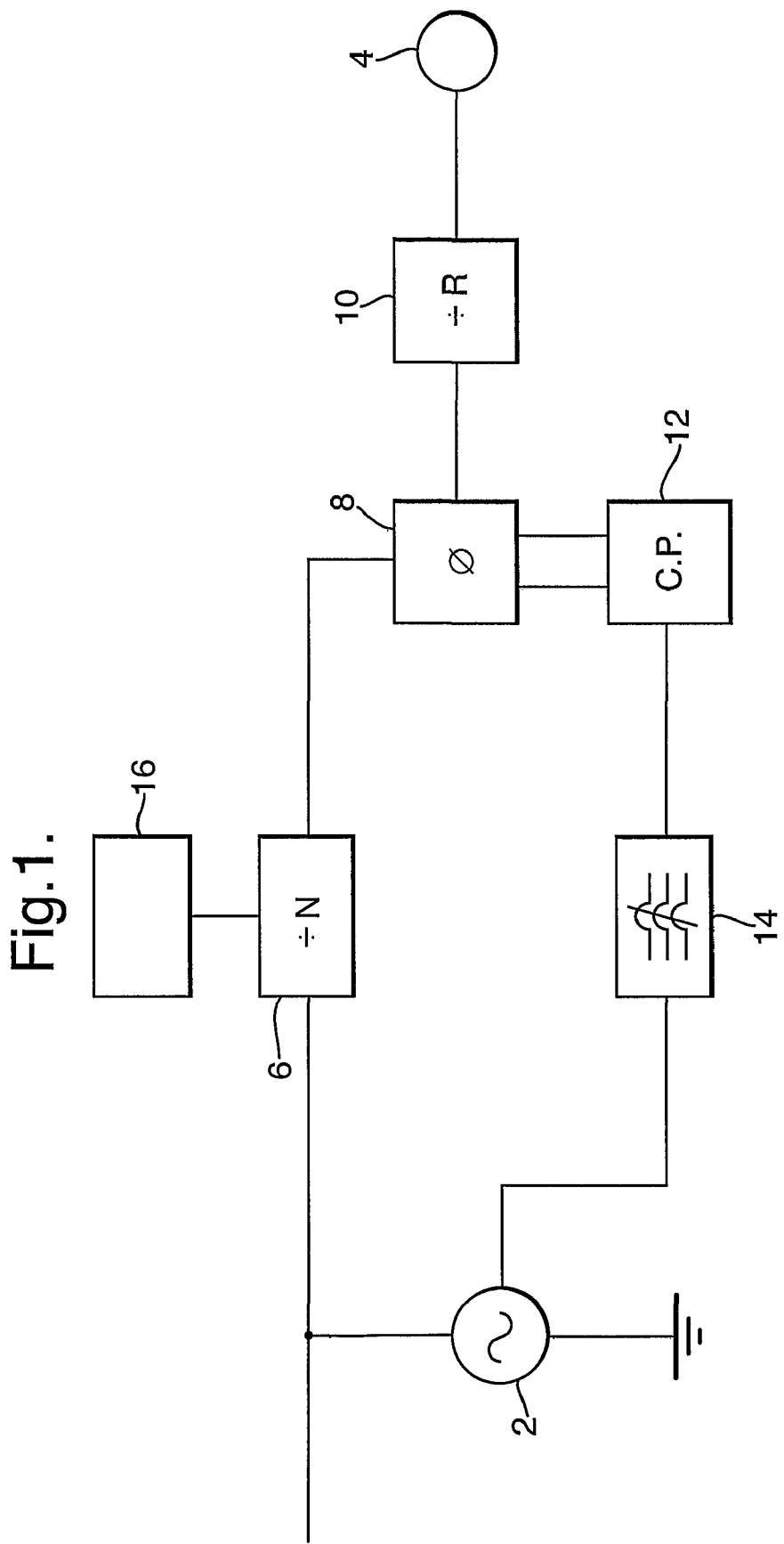
FIG. 1 illustrates a fractional-N frequency synthesizer which can embody the present invention.

In the embodiment of FIG. 1, a voltage controlled oscillator 2 is controlled with reference to a crystal 4. A divider 6 divides the output of the voltage control oscillator 2 by a factor N and a phase comparator 8 compares this divided signal with a reference signal from the crystal 4. As illustrated, the reference signal from the crystal 4 may be produced by another divider 10, which divides the signal from the crystal 4 by a factor R.

As a result of the comparison by the phase comparator 8, a charge pump 12 produces a pump-up signal and a pump-down signal. These signals are designed to be square pulses, the widths of which change according to phase differences detected by the phase detector 8. The pump-up signal is of one polarity and the pump-down signal is of an opposite polarity such that, when the phase comparator 8 detects an in-phase condition, the pump-up and pump-down signals substantially cancel each other out. When a phase difference is detected, the difference between the pump-up signal and the pump-down signal results in a signal, which by means of a low-pass filter 14, controls the voltage-controlled oscillator 2.

Where the divider 6 can only divide the output of the voltage-controlled oscillator 2 by an integral amount, it is only possible to lock the output frequency at frequencies spaced apart by relatively large intervals.

With a fractional-N frequency synthesizer, a controller 16 alternately and rapidly controls the value of N used by the divider 6 between two integral values to arrive at a fractional value. For instance, by alternating N between a value of 100 and a value of 101, an effective division of 100.5 may be achieved.

Although high-frequency noise may be filtered by the low-pass filter 14, non-linearity in the charge pump 12 can result in disturbances in the phase-locked loop and consequent poor performance. Also, increasing the values of N and R results in increased phase noise whereas low values of N and R require the charge pump to operate at a higher frequency where non-linearities become more of a problem.

With the present invention, a charge pump circuit is proposed giving greater linearity and, hence, less spurs and disturbance in the frequency synthesizer.

Figure 2:
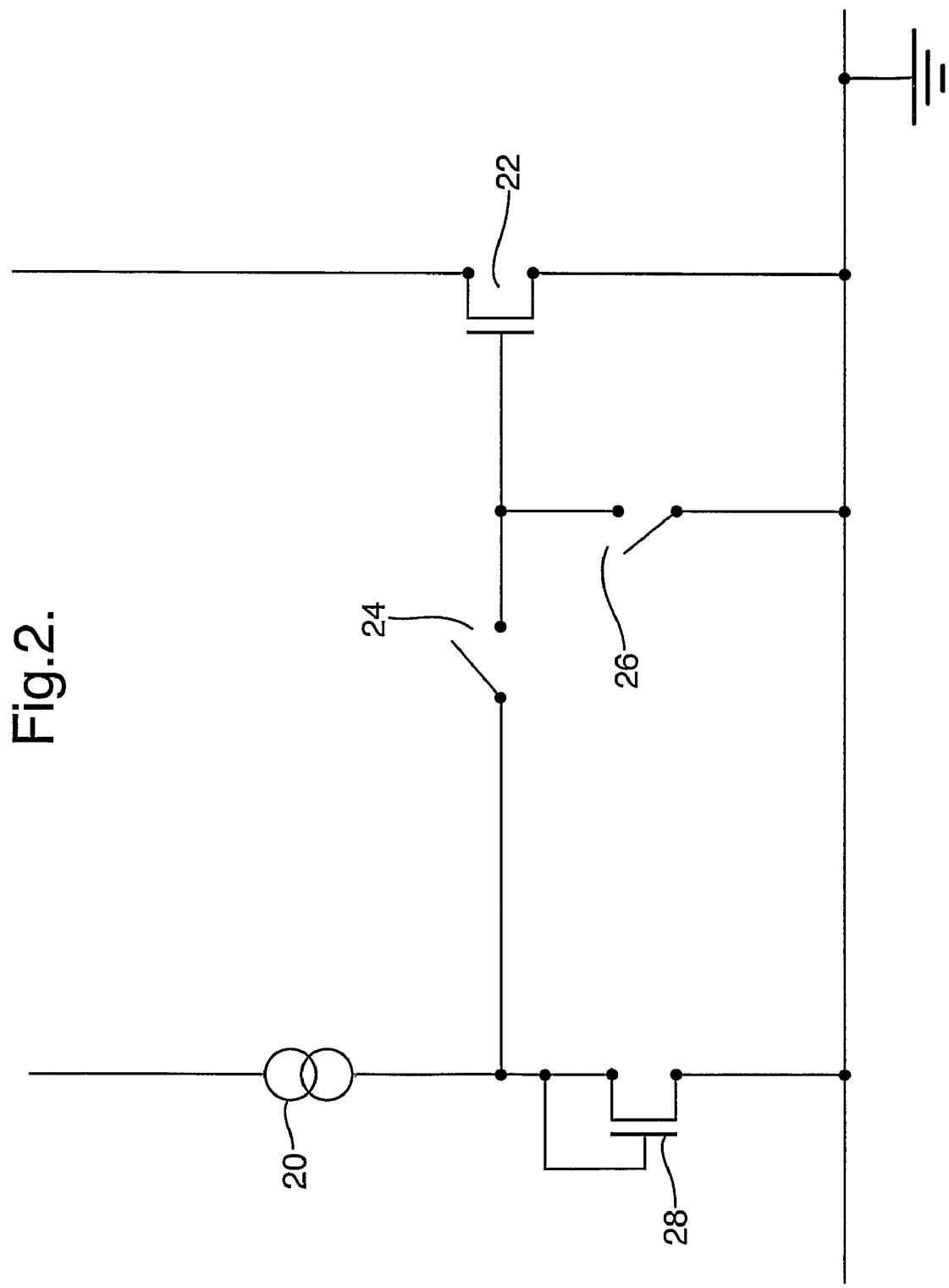
FIG. 2 illustrates a conventional charge pump design.

FIG. 2 illustrates a conventional charge pump having a current source 20 and an output n-type MOS output transistor 22, which is switched simultaneously by switches 24 and 26. An input n-type MOS transistor is connected to provide the required bias on the output transistor 22.

Switching the switches 24 and 26 causes the charge pump to output the required signal. However, because of the properties of the output transistor 22, including capacitances and the like, the response is not entirely linear and the output signal becomes undesirable at high frequencies, such as might be used in a fractional-N frequency synthesizer, for instance 13 MHz.

A complementary p-type MOS circuit may be provided in conjunction with that of FIG. 2, to provide a complete charge pump for providing pump-up and pump-down signals.

Figure 3:
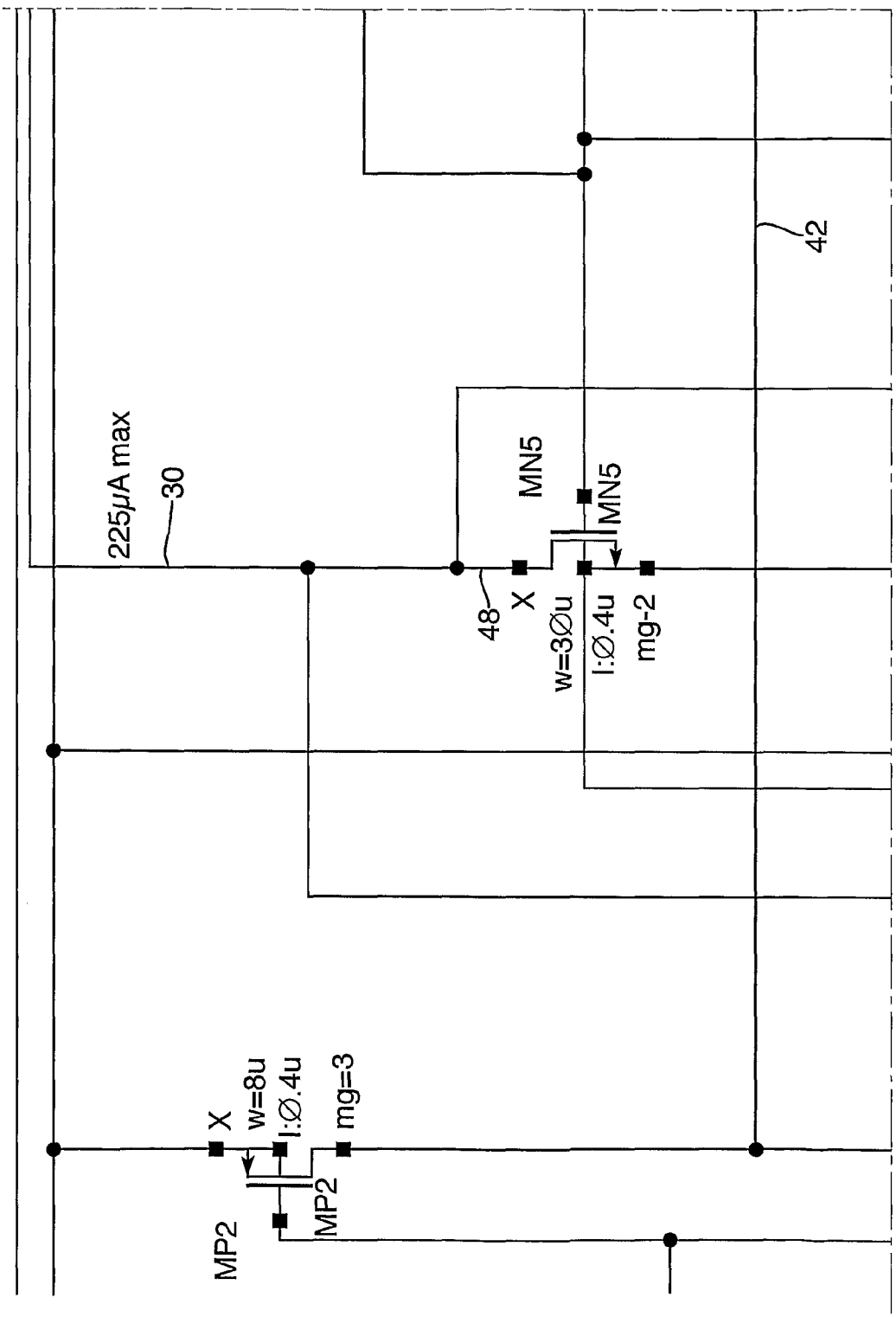
FIG. 3 illustrates a charge pump circuit embodying the present invention.

FIG. 3 illustrates a circuit embodying the present invention.

An input rail 30 provides the source of current. An n-type MOS output transistor 32 and an n-type MOS input transistor 34 are equivalent to the input and output transistors 22, 28 of FIG. 2. The input transistor 34 connects the input rail to a voltage rail 36, such as ground, and the output transistor 32 connects the voltage rail 36 to an output rail 38.

The first difference between the conventional arrangement of FIG. 2 and the embodiment of FIG. 3 is that the switches 24 and 26 are replaced by a switch 40 for connecting the output transistor 32, in particular one end of its channel, to the voltage rail 36. In the illustrated embodiment, this is an n-type MOS transistor. The switch 40 is connected to a control line 42 via a resistor 44 to be described below. Whereas in the conventional arrangement of FIG. 2, switches 24 and 26 are opened to turn off output transistor 22, in the illustrated embodiment, the control line 42 carries a signal to turn off the switch or n-type MOS transistor 40 so as to disconnect the output transistor 32 from the voltage rail 36. This provides a better defined signal when turning off the output signal.

In order to provide symmetry to the circuit, to maintain the appropriate bias on the input transistor 34 and to improve linearity of the circuit, a compensation transistor 41, of n-type as illustrated, has its channel connecting the channel of the input transistor 34 to the voltage rail 36. Its gate is connected to a predetermined voltage source as illustrated. As a result, the compensation transistor 41 mimics and provides balance to the switch 40.

There can be a problem of the output current through the channel of the output transistor 32 being dependent on the voltage of the output rail 38. To overcome this problem, an output cascode transistor, of an n-type as illustrated, is used to connect the channel of the output transistor 32 to the output rail 38. The output cascode transistor 46 maintains the output current to be substantially independent of the voltage of the output rail 38.

To provide symmetry to the circuit, to ensure that the correct bias is still provided to the input transistor 34 and output transistor 32 and to improve the accuracy of the output current and, hence, linearity, a corresponding input cascode transistor, of n-type as illustrated, connects the channel of the input transistor 34 to the input rail 30.

As illustrated, the channel of the input cascode transistor 48 connects the channel of the input transistor 34 to the input rail and the channel of the output cascode transistor 46 connects the channel of the output transistor 32 to the output rail while the gates of the input cascode transistor 48 and output cascode transistor 46 are connected together and held at an appropriate bias.

Switching the gate of the output cascode transistor 46 to ground would cause an undesirable reduction of the voltage of the gate of the input cascode transistor 48. To reduce this, a bias circuit is connected to the gate of the output cascode transistor 46.

In the illustrated embodiment, the bias circuit includes a switch transistor 50 and a bias transistor 52. The bias transistor 52 could be replaced by any other suitable element for maintaining a voltage drop. It will be seen from FIG. 3 that, when switch transistor 50 is turned on, such that its channel connects the gate of output cascode transistor 46 to the bias transistor 52, the voltage at the gate of the output cascode transistor 46 will be brought to a voltage determined by the voltage rail 36 and the voltage drop across the channel of the auxiliary transistor 52. This change in bias is arranged to turn off the output cascode transistor 46.

As illustrated, the switch transistor 50 is under the control of the control line 42. In this way, when the switch 40 disconnects the output transistor 32 from the voltage rail 36, the switch transistor 50 simultaneously causes the output cascode transistor 46 to disconnect the output transistor 32 from the output rail 38. The response and performance of the charge pump circuit are thus improved accordingly.

In the illustrated embodiment, where the charge pump circuit uses n-type devices, the switch transistor 50 is preferably an n-type MOS transistor. In order for the switch transistor 50 to be turned on at the same time that the switch 40 is turned off, an inverter 54 is provided for connecting the gate of the switch transistor 50 to the control line 42.

Preferably, a resistor 56 connects the gate of the switch transistor 50 to the inverter 54 and this will be discussed further below.

Finally, to prevent the bias circuit influencing the input transistor 34 via the input cascode transistor 48, a cascode switch 58 connects the gate of the input cascode transistor 48 to the gate of the output cascode transistor 46. The cascode switch is then arranged to disconnect these two gates at the same time as the bias circuit applies the required bias to the output cascode transistor 46.

In the illustrated embodiment, the cascode switch 58 is provided as an n-type MOS transistor with its channel connecting the gate of the input cascode transistor 48 to the gate of the output cascode transistor 46. The gate of the cascode control transistor 58 forming the cascode switch is connected to the control line 42 such that it is turned off simultaneously with turning off the control transistor 40 and turning on the switch transistor 50. As illustrated, the gate of the cascode control transistor 58 is connected to the control line 42 by a resistor 60.

The resistors 44, 56 and 60 are used in conjunction with the inherent capacitive effects of the circuit to control response times and optimised performance.

The charge pump circuit illustrated in FIG. 3 uses n-type MOS devices and, in a frequency synthesizer is intended to provide the pump-down signal. The circuit can be provided in conjunction with another charge pump circuit of p-type to provide the corresponding pump-up signal.

Since p-type devices are inherently slower than n-type devices, the resistors 44, 56 and 60 may provide the additional function of matching the n-type circuit to the corresponding p-type circuit.

Thus, there may be provided an improved charge pump using a charge pump circuit of the present invention with p-type devices and a charge pump circuit of the present invention with n-type devices. Such a charge pump may be used for the charge pump 12 of FIG. 1.

By providing a charge pump of this type, the present invention may provide a fractional-N frequency synthesizer as illustrated in FIG. 1 where values of N and R may be kept relatively low with the charge pump 12 operating at a relatively high frequency, for instance 13 MHz.

The charge pump or fractional-N frequency synthesizer can be provided as part of an integrated circuit as illustrated in FIG. 4. For example the integrated circuit could be a transceiver integrated circuit, such as a quad band transceiver integrated circuit, or a television tuner integrated circuit.

The charge pump fractional-N frequency synthesizer or integrated circuit can also be provided in a mobile telephone, such as a GSM telephone, as illustrated in FIG. 5 or a television receiver, such as a handheld receiver for DVB (Digital Video Broadcast), as illustrated in FIG. 6.

The invention claimed is:

1. A charge pump circuit comprising:
   an input rail;
   an output rail;
   a voltage rail;
   a control line;
   an MOS input transistor, the input transistor including a channel and a gate, the channel of the input transistor being connected between the input rail and the voltage rail;
   an MOS output transistor, the output transistor including a channel and a gate, the channel of the output transistor being connected between the output rail and the voltage rail, the gate of the input transistor being connected to the gate of the output transistor;
   a switch for connecting the channel of the output transistor to the voltage rail in response to a signal on the control line;
   an MOS input cascode transistor, the input cascode transistor including a channel and a gate, the channel of the input cascode transistor connecting the channel of the input transistor to the input rail;
   an MOS output cascode transistor, the output cascode transistor including a channel and a gate, the channel of the output cascode transistor connecting the channel of the output transistor to the output rail, the gate of the input cascode transistor being connected to the gate of the output cascode transistor; and
   a switched bias circuit connected between the gate of the output cascode transistor and the voltage rail for biasing the voltage of the gate of the output cascode transistor in response to an absence of the signal on the control line such that the output cascode transistor inhibits flow of current through the output transistor from the output rail; wherein
   closing and opening the switch allows current to flow and not flow respectively between the output rail and the output transistor.

2. A charge pump circuit according to claim 1 wherein: the bias circuit includes an MOS switch transistor, the switch transistor including a channel and a gate, the channel of the switch transistor being connected in series with a bias element providing a voltage drop, the gate of the switch transistor being controlled by a voltage responsive to the signal on the control line.

3. A charge pump circuit according to claim 2 wherein: the bias circuit includes an inverter connecting the gate of the switch transistor to the control line.

4. A charge pump circuit according to claim 3, further comprising:
   a bias resistor connecting the inverter to the gate of the switch transistor.

5. A charge pump circuit according to claim 2 wherein: the bias element includes an MOS bias transistor, the bias transistor including a channel and a gate, the channel of the bias transistor connecting the switch transistor to the voltage line and the gate of the bias transistor being connected between the channel of the bias transistor and the channel of the switch transistor.

6. A charge pump circuit according to claim 1 wherein: the switch is an MOS control transistor, the control transistor including a channel and a gate, the channel of the control transistor being connected between the voltage rail and the output transistor, and the gate of the control transistor being connected to the control line.

7. A charge pump circuit according to claim 6, further comprising:
   a switch resistor connecting the control line to the gate of the control transistor.

8. A charge pump circuit according to claim 6, further comprising:
   an MOS compensation transistor, the compensation transistor including a channel and a gate, the channel of the compensation transistor connecting the input transistor to the voltage rail, and the gate of the compensation transistor being held at a fixed voltage.

9. A charge pump circuit according to claim 1, further comprising:
   a cascode switch responsive to the signal on the control line to connect the gate of the input cascode transistor to the gate of the output cascode transistor.

10. A charge pump circuit according to claim 9, wherein: the cascode switch includes an MOS cascode control transistor, the cascode control transistor including a channel and a gate, the channel of the cascode control transistor being connected between the gate of the input cascode transistor and the gate of the output cascode transistor, and the gate of the cascode control transistor being connected to the control line.

11. A charge pump circuit according to claim 10, further comprising:
    a cascode resistor connecting the control line to the gate of the cascode control transistor.

12. A charge pump for use in a fractional-N frequency synthesizer, the charge pump comprising:
    a first charge pump circuit including:
       an input rail;
       an output rail;
       a voltage rail;
       a control line;
       an MOS input transistor, the input transistor including a channel and a gate, the channel of the input transistor being connected between the input rail and the voltage rail;
       an MOS output transistor, the output transistor including a channel and a gate, the channel of the output transistor being connected between the output rail and the voltage rail, the gate of the input transistor being connected to the gate of the output transistor;

a switch for connecting the channel of the output transistor to the voltage rail in response to a signal on the control line;

an MOS input cascode transistor, the input cascode transistor including a channel and a gate, the channel of the input cascode transistor connecting the channel of the input transistor to the input rail;

an MOS output cascode transistor, the output cascode transistor including a channel and a gate, the channel of the output cascode transistor connecting the channel of the output transistor to the output rail, the gate of the input cascode transistor being connected to the gate of the output cascode transistor; and a switched bias circuit connected between the gate of the output cascode transistor and the voltage rail for biasing the voltage of the gate of the output cascode transistor in response to an absence of the signal on the control line such that the output cascode transistor inhibits flow of current through the output transistor from the output rail;

wherein closing and opening said switch allows current to flow and not flow respectively between the output rail and the output transistor and wherein n-MOS transistors are used for pump down; and a second charge pump circuit including:

an input rail;

an output rail;

a voltage rail;

a control line;

an MOS input transistor, the input transistor including a channel and a gate, the channel of the input transistor being connected between the input rail and the voltage rail;

an MOS output transistor, the output transistor including a channel and a gate, the channel of the output transistor being connected between the output rail and the voltage rail, the gate of the input transistor being connected to the gate of the output transistor;

a switch for connecting the channel of the output transistor to the voltage rail in response to a signal on the control line;

an MOS input cascode transistor, the input cascode transistor including a channel and a gate, the channel of the input cascode transistor connecting the channel of the input transistor to the input rail;

an MOS output cascode transistor, the output cascode transistor including a channel and a gate, the channel of the output cascode transistor connecting the channel of the output transistor to the output rail, the gate of the input cascode transistor being connected to the gate of the output cascode transistor; and a switched bias circuit connected between the gate of the output cascode transistor and the voltage rail for biasing the voltage of the gate of the output cascode transistor in response to an absence of the signal on the control line such that the output cascode transistor inhibits flow of current through the output transistor from the output rail;

wherein closing and opening the switch allows current to flow and not flow respectively between the output rail and the output transistor, and wherein p-MOS transistors are used for pump up to complement the first charge pump circuit using n-MOS transistors.

13. A fractional-N frequency synthesizer comprising:

a voltage controlled oscillator;

a fractional N divider connected to the output of the voltage controlled oscillator and providing a divided signal;

a phase comparator for comparing the divided signal with a reference signal and providing a comparison output;

a charge pump according to claim 12 for receiving the comparison output as an input and providing pump down and pump up outputs; and a filter for filtering a sum of the pump down and pump up outputs and providing the filtered sum as an input to the voltage controlled oscillator.

14. An integrated circuit including a fractional N-frequency synthesizer according to claim 13.

15. An integrated circuit according to claim 14 which is a quad band transceiver integrated circuit.

16. An integrated circuit according to claim 14 which is a television tuner integrated circuit.

17. A mobile telephone including a fractional N-frequency synthesizer according to claim 13.

18. A television receiving including a fractional-N frequency synthesizer according to claim 13.

19. An integrated circuit including a charge pump according to claim 12.

20. An integrated circuit according to claim 19 which is a quad band transceiver integrated circuit.

21. An integrated circuit according to claim 19 which is a television tuner integrated circuit.

22. A mobile telephone including a charge pump according to claim 12.

23. A television receiver including a charge pump according to claim 12.

24. A charge pump circuit comprising:

an input rail;

an output rail;

a voltage rail;

a control line;

an MOS input transistor, the input transistor including a channel and a gate, the channel of the input transistor being connected between the input rail and the voltage rail;

an MOS output transistor, the output transistor including a channel and a gate, the channel of the output transistor being connected between the output rail and the voltage rail, the gate of the input transistor being connected to the gate of the output transistor;

a switch for connecting the channel of the output transistor to the voltage rail in response to a signal on the control line;

an MOS input cascode transistor, the input cascode transistor including a channel and a gate, the channel of the input cascode transistor connecting the channel of the input transistor to the input rail;

an MOS output cascode transistor, the output cascode transistor including a channel and a gate, the channel of the output cascode transistor connecting the channel of the output transistor to the output rail, the gate of the input cascode transistor being connected to the gate of the output cascode transistor; and a cascode switch responsive to the signal on the control line to connect the gate of the input cascode transistor to the gate of the output cascode transistor; wherein closing and opening the switch allows current to flow and not flow respectively between the output rail and the output transistor.

25. A charge pump circuit according to claim 24, wherein:
the cascode switch includes an MOS cascode control transistor, the cascode control transistor including a channel and a gate, the channel of the cascode control transistor being connected between the gate of the input cascode transistor and the gate of the output cascode transistor, and the gate of the cascode control transistor being connected to the control line.

26. A charge pump circuit according to claim 25, further comprising:
a cascode resistor connecting the control line to the gate of the cascode control transistor.

27. A charge pump for use in a fractional-N frequency synthesizer, the charge pump comprising:
a first charge pump circuit including:
  an input rail;
  an output rail;
  a voltage rail;
  a control line;
  an MOS input transistor, the input transistor including a channel and a gate, the channel of the input transistor being connected between the input rail and the voltage rail;
  an MOS output transistor, the output transistor including a channel and a gate, the channel of the output transistor being connected between the output rail and the voltage rail, the gate of the input transistor being connected to the gate of the output transistor;
  a switch for connecting the channel of the output transistor to the voltage rail in response to a signal on the control line;
  an MOS input cascode transistor, the input cascode transistor including a channel and a gate, the channel of the input cascode transistor connecting the channel of the input transistor to the input rail;
  an MOS output cascode transistor, the output cascode transistor including a channel and a gate, the channel of the output cascode transistor connecting the channel of the output transistor to the output rail, the gate of the input cascode transistor being connected to the gate of the output cascode transistor; and
  a cascode switch responsive to the signal on the control line to connect the gate of the input cascode transistor to the gate of the output cascode transistor;
  wherein closing and opening said switch allows current to flow and not flow respectively between the output rail and the output transistor and wherein n-MOS transistors are used for pump down; and
a second charge pump circuit including:
  an input rail;
  an output rail;
  a voltage rail;
  a control line;
  an MOS input transistor, the input transistor including a channel and a gate, the channel of the input transistor being connected between the input rail and the voltage rail;
  an MOS output transistor, the output transistor including a channel and a gate, the channel of the output transistor being connected between the output rail and the voltage rail, the gate of the input transistor being connected to the gate of the output transistor;
  a switch for connecting the channel of the output transistor to the voltage rail in response to a signal on the control line;
  an MOS input cascode transistor, the input cascode transistor including a channel and a gate, the channel of the input cascode transistor connecting the channel of the input transistor to the input rail;
  an MOS output cascode transistor, the output cascode transistor including a channel and a gate, the channel of the output cascode transistor connecting the channel of the output transistor to the output rail, the gate of the input cascode transistor being connected to the gate of the output cascode transistor; and
  a cascode switch responsive to the signal on the control line to connect the gate of the input cascode transistor to the gate of the output cascode transistor;
  wherein closing and opening the switch allows current to flow and not flow respectively between the output rail and the output transistor, and wherein p-MOS transistors are used for pump up to complement the first charge pump circuit using n-MOS transistors.

28. A fractional-N frequency synthesizer comprising:
a voltage controlled oscillator;
a fractional N divider connected to the output of the voltage controlled oscillator and providing a divided signal;
a phase comparator for comparing the divided signal with a reference signal and providing a comparison output;
a charge pump according to claim 27 for receiving the comparison output as an input and providing pump down and pump up outputs; and
a filter for filtering a sum of the pump down and pump up outputs and providing the filtered sum as an input to the voltage controlled oscillator.

29. An integrated circuit including a charge pump according to claim 27.

30. An integrated circuit according to claim 29 which is a quad band transceiver integrated circuit.

31. An integrated circuit including a fractional N-frequency synthesizer according to claim 28.

32. An integrated circuit according to claim 31 which is a quad band transceiver integrated circuit.

33. A mobile telephone including a charge pump according to claim 27.

34. A mobile telephone including a fractional N-frequency synthesizer according to claim 28.

35. An integrated circuit according to claim 29 which is a television tuner integrated circuit.

36. An integrated circuit according to claim 31 which is a television tuner integrated circuit.

37. A television receiver including a charge pump according to claim 27.

38. A television receiving including a fractional-N frequency synthesizer according to claim 28.

* * * * *